US011329200B2

United States Patent
Lin et al.

(10) Patent No.: US 11,329,200 B2
(45) Date of Patent: May 10, 2022

(54) OPTOELECTRONIC DEVICE WITH WAVELENGHTH COVERSION MATERIAL IN HOLLOW STRUCTURE FOR BLUE LIGHT LEAKAGE RATE REDUCTION

(71) Applicant: KAISTAR Lighting (Xiamen) Co., Ltd., Xiamen (CN)

(72) Inventors: Kunbin Lin, Xiamen (CN); Shaofeng Zhang, Xiamen (CN)

(73) Assignee: KAISTAR LIGHTING (XIAMEN) CO., LTD., Xiamen (CN)

( * ) Notice: Subject to any disclaimer, the term of this patent is extended or adjusted under 35 U.S.C. 154(b) by 0 days.

(21) Appl. No.: 16/911,847

(22) Filed: Jun. 25, 2020

(65) Prior Publication Data

US 2021/0005792 A1    Jan. 7, 2021

(30) Foreign Application Priority Data

Jul. 5, 2019  (CN) .......................... 201910601783.1

(51) Int. Cl.
  *H01L 33/50*  (2010.01)
  *H01L 27/15*  (2006.01)
  *H01L 33/58*  (2010.01)

(52) U.S. Cl.
  CPC .......... *H01L 33/505* (2013.01); *H01L 27/156* (2013.01); *H01L 33/502* (2013.01); *H01L 33/58* (2013.01); *H01L 2933/0058* (2013.01)

(58) Field of Classification Search
  CPC ..... H01L 33/505; H01L 33/502; H01L 33/58; H01L 2933/0058; H01L 33/50–508; H01L 2933/0041
  See application file for complete search history.

(56) References Cited

U.S. PATENT DOCUMENTS

| | | | |
|---|---|---|---|
| 2014/0256071 A1* | 9/2014 | Park | H01L 33/60 438/27 |
| 2015/0097199 A1* | 4/2015 | Chen | H01L 33/504 257/88 |
| 2017/0254051 A1* | 9/2017 | Hassanein | E02F 9/267 |

* cited by examiner

*Primary Examiner* — Jay C Chang
*Assistant Examiner* — Mikka Liu
(74) *Attorney, Agent, or Firm* — Hemisphere Law, PLLC; Zhigang Ma

(57) ABSTRACT

An optoelectronic device and a manufacturing method thereof are provided. The optoelectronic device includes a transparent substrate, an optoelectronic chip, electrodes and a wavelength conversion layer. The transparent substrate is provided with a hollow structure and an installation area, the hollow structure penetrates through two opposite surfaces of the transparent substrate and is located at a periphery of the installation area. The optoelectronic chip is arranged in the installation area. The electrodes are arranged on the transparent substrate and electrically connected to the optoelectronic chip; and the wavelength conversion layer is arranged on the two opposite surfaces of the transparent substrate and filled in the hollow structure, wherein the optoelectronic chip is covered by the wavelength conversion layer. The effect of reducing leakage rate of blue light of an optoelectronic device such as a LED packaging structure can be achieved.

11 Claims, 10 Drawing Sheets

A-A

OPTOELECTRONIC DEVICE WITH WAVELENGHTH COVERSION MATERIAL IN HOLLOW STRUCTURE FOR BLUE LIGHT LEAKAGE RATE REDUCTION

TECHNICAL FIELD

The disclosure relates to the field of semiconductor technologies, and more particularly to an optoelectronic device and a manufacturing method thereof.

DESCRIPTION OF RELATED ART

With the continuous development of LED industries, the cost-effective advantages of LED products are becoming increasingly prominent, and the market share of LED products is also expanding. At the same time, the requirements for LED packaging structures are becoming higher and higher. Existing one kind of LED packaging structures require a series of operations on the initial transparent substrate during the manufacturing process, including pre-cutting, forming circuit layout, solid crystal bonding wires, and applying fluorescent glue, and then cutting to form a monolithic light source of LED packaging structure, resulting in a small amount of blue light emitted from the LED chip on the side of the transparent substrate of the formed LED packaging structure, resulting in blue light hazard. Usually blue light has extremely high energy and can penetrate the lens retina. Exposure of blue light to the retina can cause retinal pigment epithelial cells to age, resulting in lack of nutrients in the light-sensitive cells and causing vision damage, and these damages are irreversible.

Therefore, at this stage, there is an urgent need for an LED packaging structure that can reduce blue light leakage, so that LED products are more in line with photobiological safety.

SUMMARY

Accordingly, embodiments of the disclosure provide an optoelectronic device and a manufacturing method thereof, which can reduce leakage rate of blue light.

In an aspect, an embodiment of the disclosure provides an optoelectronic device including a transparent substrate, an optoelectronic chip, electrodes and a wavelength conversion layer. The transparent substrate is provided with a hollow structure and an installation area, the hollow structure penetrates through two opposite surfaces of the transparent substrate and is located at a periphery of the installation area. The optoelectronic chip is arranged in the installation area. The electrodes are arranged on the transparent substrate and electrically connected to the optoelectronic chip. The wavelength conversion layer is arranged on the two opposite surfaces of the transparent substrate and filled in the hollow structure. The optoelectronic chip is covered by the wavelength conversion layer.

In an embodiment, the hollow structure includes a first hollow unit and a second hollow unit respectively arranged on a first side and a second side of the installation area, and the second side being opposite to the first side.

In an embodiment, the first hollow unit is a continuous elongated through-hole penetrating through the two opposite surfaces of the transparent substrate.

In an embodiment, the first hollow unit includes a plurality of elongated through-holes arranged staggeredly and penetrating through the two opposite surfaces of the transparent substrate.

In an embodiment, the hollow structure further includes a third hollow unit arranged on a third side of the installation area, the third side is located between the first side and the second side.

In an embodiment, a width of the continuous elongated through-hole is in a range of 0.2 mm-0.5 mm.

In an embodiment, a width of each of the plurality of elongated through-holes is in a range of 0.2 mm-0.5 mm.

In an embodiment, the first hollow unit is an elongated side trough penetrating through the two opposite surfaces of the transparent substrate.

In an embodiment, the wavelength conversion layer includes a first wavelength conversion sublayer, a second wavelength conversion sublayer and a third wavelength conversion sublayer. The first wavelength conversion sublayer is arranged on a first surface of the two opposite surfaces, and in the installation area, and further covering the optoelectronic chip. The second wavelength conversion sublayer is arranged on a side of the first wavelength conversion sublayer facing away from the optoelectronic chip and filled in the hollow structure. The third wavelength conversion sublayer is arranged on a second surface of the two opposite surfaces, and covering the hollow structure.

In an embodiment, the second wavelength conversion sublayer includes a first matrix and a first phosphor dispersed in the first matrix, the third wavelength conversion sublayer includes a second matrix and a second phosphor dispersed in the second matrix. The first phosphor and the second phosphor are a same monochromatic phosphor or a same mixture of phosphors.

In an embodiment, the optoelectronic chip is located on the first surface, and the hardness of the first matrix is lower than the hardness of the second matrix.

In another aspect, an embodiment of the disclosure provides a manufacturing method of an optoelectronic device, comprising:

providing a transparent substrate with electrodes, wherein the transparent substrate is provided with a hollow structure and an installation area, the hollow structure penetrates through two opposite surfaces of the transparent substrate and is located at a periphery of the installation area to surround the installation area;

arranging an optoelectronic chip in the installation area of the transparent substrate, and electrically connecting the optoelectronic chip with the electrodes; and forming a wavelength conversion layer on the transparent substrate, wherein the wavelength conversion layer is located on the two opposite surfaces of the transparent substrate and filled in the hollow structure, and the optoelectronic chip is covered by the wavelength conversion layer.

In an embodiment, providing a transparent substrate with electrodes includes:

providing a transparent initial substrate;

pre-cutting the transparent initial substrate;

forming the hollow structure penetrating through the two opposite surfaces of the transparent initial substrate and being located at the periphery of the installation area, on the transparent initial substrate; and forming the electrodes on the transparent initial substrate.

In an embodiment, forming a wavelength conversion layer on the transparent substrate, includes:

forming a first wavelength conversion sublayer on a first surface of the two opposite surfaces of the transparent substrate, and the first wavelength conversion sublayer is located in the installation area and covers the optoelectronic chip;

forming a second wavelength conversion sublayer on a side of the first wavelength conversion sublayer facing away from the optoelectronic chip, and the second wavelength conversion sublayer is filled in the hollow structure; and forming a third wavelength conversion sublayer on a second surface of the two opposite surfaces of the transparent substrate, and the third wavelength conversion sublayer covers the hollow structure.

The above technical solutions may have one or more of the following advantages or benefits: by filling the wavelength conversion layer in the hollow structure, which can effectively reduce the proportion of blue light exposed from the side of the transparent substrate when the optoelectronic chip such as LED chip is lit, and effectively reduce the damage to human eyes; moreover, compared with the traditional dispensing process, the dispensing process layer by layer for forming the first wavelength conversion sublayer first and then the second wavelength conversion sublayer on the optoelectronic chip such as LED chip can effectively improve the brightness of the optoelectronic chip such as LED chip.

BRIEF DESCRIPTION OF THE DRAWINGS

In order to more clearly illustrate technical solutions of embodiments of the disclosure, drawings used in the description of the embodiments will be briefly described below. Apparently, the drawings described below are merely some embodiments of the disclosure, and those skilled in the art can obtain other drawings based on these drawings without creative efforts.

DETAILED DESCRIPTION OF EMBODIMENTS

The technical solutions in the embodiments of the disclosure will be clearly and completely described below, with reference to the accompanying drawings in the embodiments of the disclosure. Apparently, the described embodiments are merely some of the embodiments of the disclosure, not all embodiments. Based on the described embodiments of the disclosure, all the other embodiments obtained by those skilled in the art without any creativity should belong to the protective scope of the disclosure.

It should be noted that the terms "first" and "second" in the description and claims of the disclosure and the above drawings are used to distinguish similar objects, and do not have to be used to describe a specific order or sequence. It should be understood that the terms so used are interchangeable under appropriate circumstances so that the embodiments of the disclosure described herein can be implemented in an order other than those illustrated or described herein. In addition, the terms "including" and "having" and any variations thereof are intended to cover non-exclusive inclusions, for example, processes, methods, systems, products or devices that contain a series of steps or units need not be limited to those clearly listed those steps or units, but may include other steps or units not explicitly listed or inherent to these processes, methods, products or equipment.

First Embodiment

Figure 2:
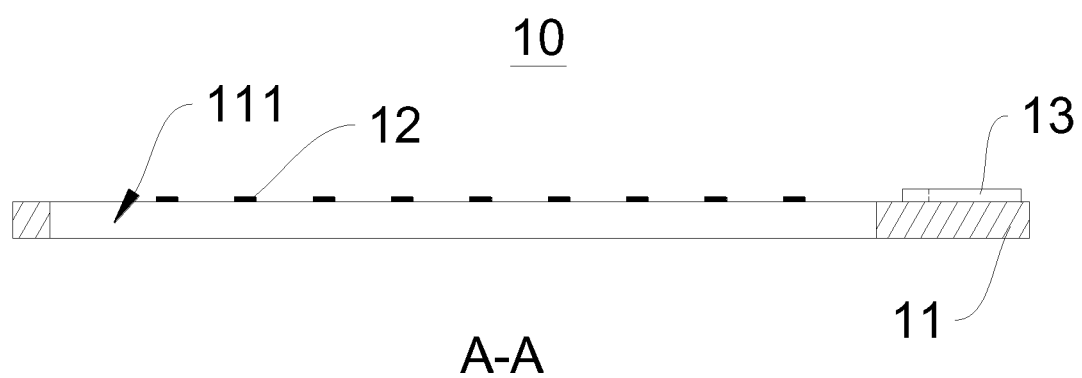
FIG. 2 is a cross-sectional view of the optoelectronic device shown in FIG. 1 according to the first embodiment of the disclosure.
Figure 3:
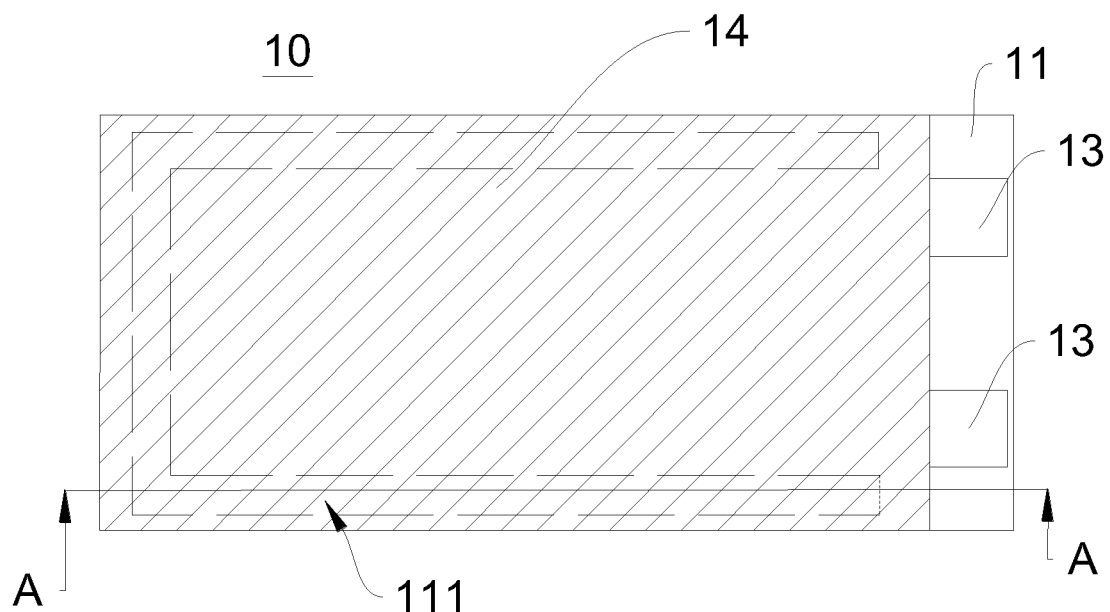
FIG. 3 is a schematic structural view of an optoelectronic device according to the first embodiment of the disclosure.
Figure 4:
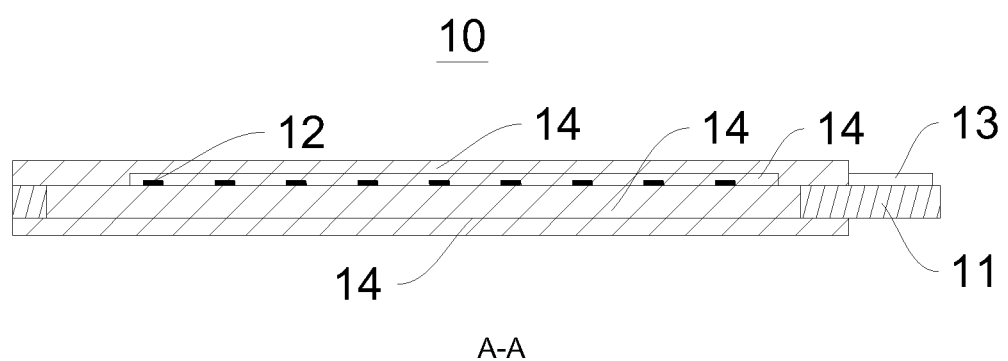
FIG. 4 is a cross-sectional view of the optoelectronic device shown in FIG. 0.3 according to the first embodiment of the disclosure.

As shown in FIGS. 1-4, a first embodiment of the disclosure provides an optoelectronic device such as an LED package structure. As shown in FIG. 4, the optoelectronic device 10 includes, for example, a transparent substrate 11, an optoelectronic chip 12, electrodes 13 and a wavelength conversion layer 14.

Figure 1:
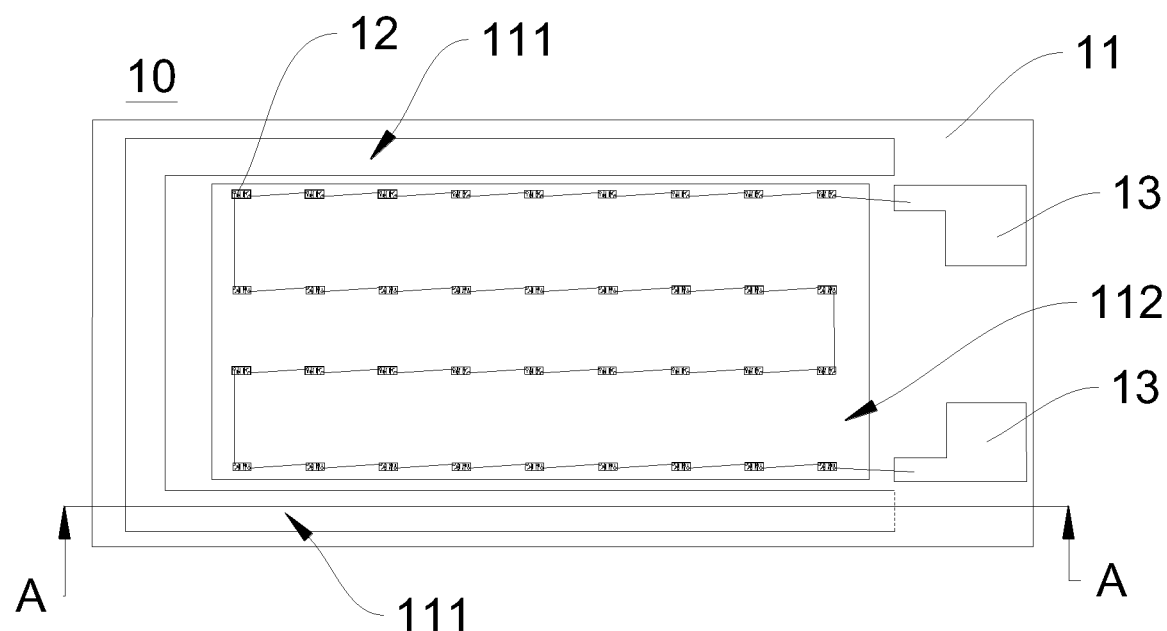
FIG. 1 is a partial schematic structural view of an optoelectronic device according to a first embodiment of the disclosure.

As shown in FIG. 1 and FIG. 2, the transparent substrate 11 is provided with a hollow structure 111 and an installation area 112, the installation area 112 is, for example, a bonding area for mounting the optoelectronic chip 12 such as an LED chip. The hollow structure 111 penetrates through two opposite surfaces of the transparent substrate 11 and is located at a periphery of the installation area 112. The optoelectronic chip 12 such as the LED chip is arranged in the installation area 112. The electrodes 13 are arranged on the transparent substrate 11 and electrically connected to the optoelectronic chip 12 such as the LED chip. The electrodes 13 are arranged in pairs, for example. As shown in FIG. 3 and FIG. 4, the wavelength conversion layer 14 is arranged on the two opposite surfaces of the transparent substrate 11 and filled in the hollow structure 111. The optoelectronic chip 12 such as the LED chip is covered by the wavelength conversion layer 14. For example, the wavelength conversion layer 14 is a fluorescent glue layer. FIG. 3 shows that the shape is the shape of the final packaged product, at least a part of the outer surfaces of the two opposite sides of the transparent substrate with the hollow structure are not covered by the fluorescent glue.

Specifically, the transparent substrate 11 is made of a transparent material such as ceramic, sapphire, or glass. The ceramic is, for example, one of alumina, aluminum nitride, zirconia, and calcium fluoride. It should be noted that the disclosure does not limit the specific shape of the transparent substrate 11. For example, in the figure, the transparent substrate 11 is rectangular. The optoelectronic chip 12 is, for example, an LED chip. It should be noted that this embodiment does not limit the specific number of LED chips. The number of LED chips illustrated in the foregoing figures is only for better description of this embodiment. For example, pluralities of the LED chips are connected in series to be electrically connected to the electrodes. Of course, the disclosure is not limited to this. The electrodes 13 are made by a thick film process or a thin film process, for example, the electrodes 13 are silver disks made by a thick film process (for example, sintering method), or made by a thin film process (for example, evaporation or sputtering) Copper plates, nickel plates or gold plates.

Figure 5:
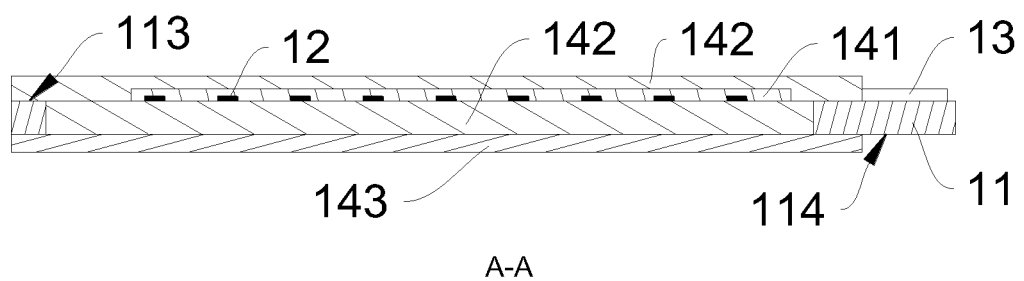
FIG. 5 is a schematic structural view of a wavelength conversion layer in the optoelectronic device shown in FIG. 4 according to the first embodiment of the disclosure.

Further, as shown in FIG. 5, the wavelength conversion layer 14 includes, for example, three wavelength conversion sublayers: a wavelength conversion sublayer 141, a wavelength conversion sublayer 142, and a wavelength conversion sublayer 143. The wavelength conversion sublayer 141 is arranged on a first surface 113 of the two opposite surfaces of the transparent substrate 11, and in the installation area 112, and further covers the optoelectronic chip 12 such as LED chip. The wavelength conversion sublayer 142 is arranged on a side of the wavelength conversion sublayer 141 facing away from the optoelectronic chip 12 and filled in the hollow structure 111. The wavelength conversion sublayer 143 is arranged on a second surface 114 of the two opposite surfaces of the transparent substrate 11, and covers the hollow structure 111.

Specifically, the wavelength conversion sublayer 142 is, for example, a fluorescent glue layer, and includes a first matrix (may be also referred to as base material) and a first phosphor dispersed in the first matrix. The wavelength conversion sublayer 143 is, for example, a fluorescent glue layer, and includes a second matrix and a second phosphor dispersed in the second matrix. The first phosphor and the second phosphor are, for example, a same single-color phosphor (not limited to a single-wavelength phosphor) or a same mixture of phosphors. For example, the first phosphor and the second phosphor mentioned are, for example, a mixture of yellow phosphor and green phosphor, a yellow phosphor, or a green phosphor. The first matrix and the second matrix mentioned are, for example, matrixes with different hardness, and a hardness of the first matrix is lower than a hardness of the second matrix. For example, the first matrix and the second matrix use Shore A type hardness tester to measure the hardness, that is, the measured hardness is Shore A hardness. The Shore A hardness of the first matrix is, for example, 55 or less, and the Shore A hardness of the second matrix is, for example, 70 or more. Specifically, the difference between the Shore A hardness of the first matrix and the Shore A hardness of the second matrix may be greater than or equal to 15. In addition, in other embodiments of the disclosure, on the premise that the hardness of the first matrix is lower than the hardness of the second matrix, the hardness of the first matrix and the second matrix can also be represented by Shore D hardness, Its Shore D hardness is greater than or equal to 20. The material of the first matrix may be a transparent adhesive material, such as epoxy resin, silica gel, methyl silicone resin, phenyl silicone resin, methyl phenyl silicone resin or modified silicone resin. The material of the second matrix may be a transparent adhesive material, such as epoxy resin, silica gel, methyl silicone resin, phenyl silicone resin, methyl phenyl silicone resin or modified silicone resin. In this embodiment, epoxy resin, silica gel, methyl silicone resin, phenyl silicone resin, methyl phenyl silicone resin or modified silicone resin are used as the original materials of the first matrix and the second matrix, and the hardness difference between the first matrix and the second matrix is achieved by adjusting the ratio between the original material of the first matrix or the second matrix, the filler and the auxiliary agent. By using the first matrix and the second matrix, the optoelectronic device 10 can have higher structural strength and lower cost. In addition, since the wavelength conversion sublayer 142 and the wavelength conversion sublayer 143 are formed using different the first matrix and the second matrix, the first matrix can be designed to use materials with higher heat resistance and better heat dissipation performance. The second matrix can be designed to use materials with more general heat resistance and heat dissipation. In this way, it is easy to keep the optoelectronic device 10 at a low cost while ensuring that the entire optoelectronic device 10 dissipates heat quickly and uniformly. The wavelength conversion sublayer 141 is, for example, a fluorescent glue layer, and includes a third matrix and a third phosphor dispersed on the third matrix. For example, the material of the third matrix may be a transparent glue material, such as epoxy resin, silica gel, methyl silicone resin, phenyl silicone resin, methyl phenyl silicone resin or modified silicone resin. The third phosphor mentioned is, for example, a single-color phosphor (not limited to a single-wavelength phosphor), specifically a red phosphor. The material of the wavelength conversion sublayer 141 is obtained by mixing and stirring the red phosphor with the third matrix at a concentration of 3 to 10%, for example. The wavelength conversion sublayer 142 and the wavelength conversion sublayer 143 are, for example, obtained by mixing and stirring the mixture of the yellow phosphor and the green phosphor with the corresponding first and second matrixes at a concentration of 20 to 60%.

Specifically, the wavelength conversion sublayer 141 and the wavelength conversion sublayer 142 mentioned in this embodiment are formed by a dispensing process layer by layer, in which the wavelength of the excited peak of the third phosphor included in the wavelength conversion sublayer 141 is within the first wavelength range, the wavelength of the excited peak of the first phosphor included in the wavelength conversion sublayer 142 is within the second wavelength range, and the second wavelength range is different from the first wavelength range. For example, the first wavelength range may be between 600 nm and 660 nm, and the second wavelength range is between 500 nm and 575 nm. Taking the embodiment with a first wavelength range between 600 nm and 660 nm as an example, the third phosphor mentioned in the embodiment of the disclosure may include one or more phosphor materials with an emission peak wavelength in the first wavelength range. For example, a nitride phosphor with an excited peak wavelength of 625 nm, a nitride phosphor with an excited peak wavelength of 651 nm, a nitride phosphor with an excited peak wavelength of 615 nm, or an excited peak wavelength between 600 nm and 660 nm can be used alone, the phosphor of other nitrides or other components can also be selected from two or more of the above-mentioned phosphors and mixed into the third phosphor mentioned in the embodiment of the invention. The phosphors are mixed according to a predetermined ratio to form a nitride phosphor mixture with an emission peak wavelength of 635 nm, and this is used as the third phosphor mentioned in the embodiment of the disclosure. As long as it meets the limitations of the disclosure, according to the actual application of product requirements and material sources and cost factors, comprehensive consideration and selection of one or more phosphor materials can be considered as the third phosphor.

In the embodiment of the disclosure, the third phosphor and the first phosphor are respectively packaged in the wavelength conversion sublayer 141 and the wavelength conversion sublayer 142, and the wavelength conversion sublayer 142 covers the outside (above) of the wavelength conversion sublayer 141, And can ensure that the light after the first phosphor conversion wavelength will not be absorbed by the third phosphor and convert the wavelength again, therefore, not only can further avoid unnecessary loss of light energy under repeated conversion, in addition, can also effectively improve the color rendering index.

Figure 6:
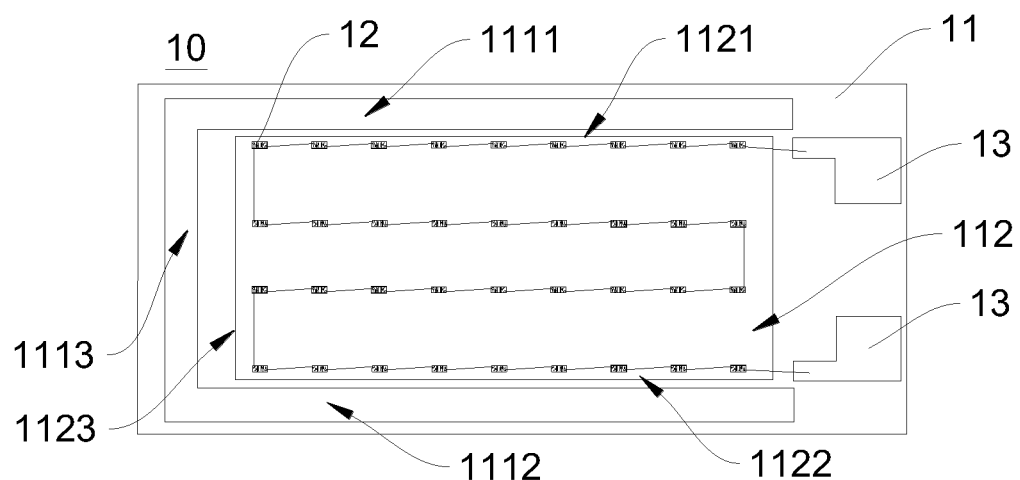
FIG. 6 is a schematic view of a hollow structure in the optoelectronic device according to the first embodiment of the disclosure.

Further, in this embodiment, as shown in FIG. 6, the hollow structure 111 includes, for example, a hollow unit 1111, a hollow unit 1112 and a hollow unit 1113. The hollow unit 1111, the hollow unit 1112 and the hollow unit 1113 are respectively located in the first side 1121, the second side 1122 and the third side 1123 of the installation area 112. Among them, the first side 1121 and the second side 1122 are opposite sides. The hollow unit 1111, the hollow unit 1112 and the hollow unit 1113 are, for example, a continuous elongated through-hole penetrating through the two opposite surfaces of the transparent substrate 11. The hollow unit 1111 is communicated with the hollow unit 1113, and the hollow unit 1112 is communicated with the hollow unit 1113. Among them, the communicated elongated through-holes can simplify the production process. It should be noted that, in other embodiments, the hollow unit 1111 and the hollow unit 1113 may be communicated or not communicated, and the hollow unit 1112 and the hollow unit 1113 may also be communicated or not communicated. FIG. 6 shows that the shape is not the final shape of the product (there is no fluorescent glue), because in the actual manufacturing process, fluorescent glue needs to be coated first, and then cut to form a final packaged product, so in the final packaged product, at least a part of the outer surface of the two opposite sides of the transparent substrate with the hollow structure is not covered by the fluorescent glue.

A width of the elongated through-hole is, for example, in a range of 0.2 mm-0.5 mm. The width of the elongated through-hole is set so that the fluorescent glue can smoothly be filled in the through hole, and considering the thickness of the transparent substrate itself, the minimum distance from the hollow unit to the edge of the transparent substrate can be set to be greater than or equal to 0.15 mm.

It should be noted that the embodiment of the disclosure does not limit the specific shape of the hollow unit. For example, the hollow unit may also be a parallelogram or a trapezoid. In addition, the disclosure does not limit the arrangement of the hollowing units. Of course, the disclosure does not limit the number of hollow units. The foregoing is only for a better understanding of this embodiment.

In summary, the optoelectronic device such as the LED package structure provided in this embodiment can effectively reduce the proportion of blue light exposed from the side of the transparent substrate when the optoelectronic chip such as the LED chip is lit by filling the wavelength conversion layer such as a fluorescent glue layer in the hollow structure, and effectively reduce the damage to human eyes, moreover, compared with the traditional dispensing process, the dispensing process layer by layer for forming the first wavelength conversion sublayer first and then the second wavelength conversion sublayer on the optoelectronic chip such as the LED chip can effectively improve the brightness of the optoelectronic chip such as the LED chip.

Second Embodiment

Figure 7A:
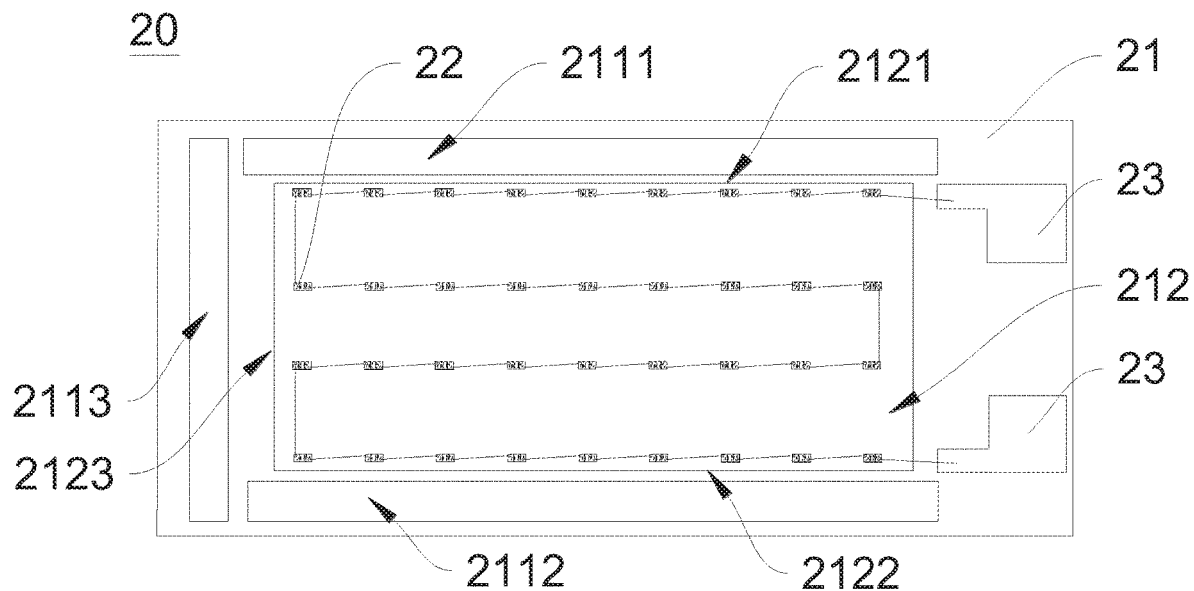
FIG. 7a is a partial schematic structural view of an optoelectronic device according to a second embodiment of the disclosure.
Figure 7B:
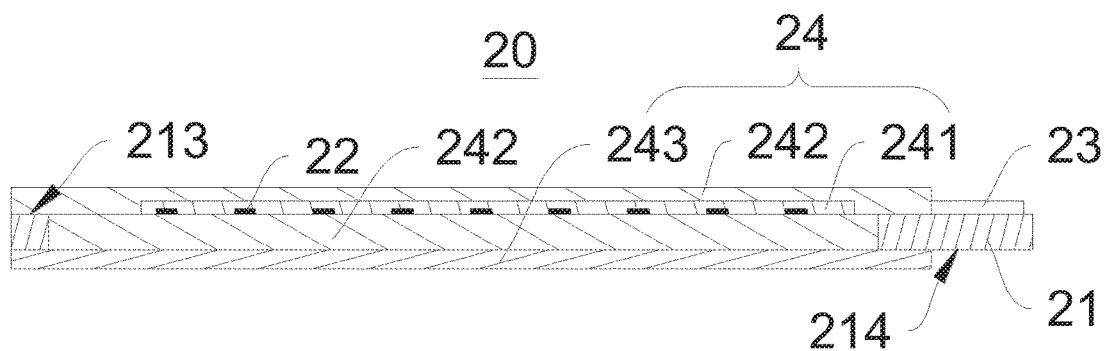
FIG. 7b is a schematic structural view of the optoelectronic device according to the second embodiment of the disclosure.
Figure 7C:
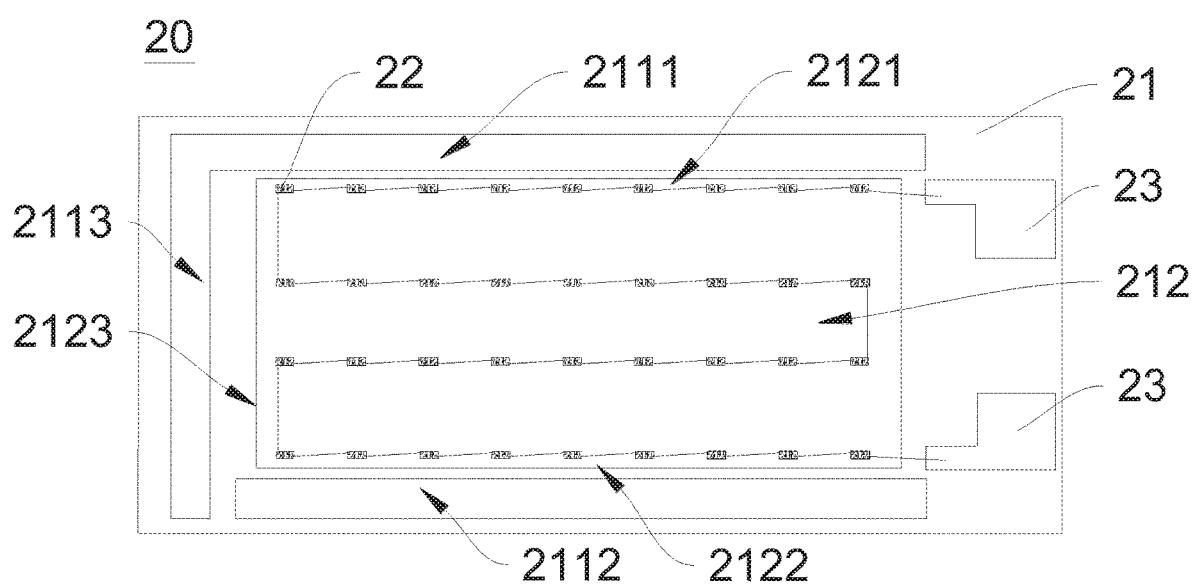
FIG. 7c is a schematic structural view of another part of the optoelectronic device according to the second embodiment of the disclosure.

As shown in FIGS. 7a-7c, a second embodiment of the disclosure provides an optoelectronic device such as an LED package structure. As shown in FIGS. 7a-7c, the optoelectronic device 20 is similar to the optoelectronic device 10, and includes, for example, a transparent substrate 21, an optoelectronic chip 22, electrodes 23 and a wavelength conversion layer 24. Among them, the transparent substrate 21 is provided with a hollow structure and an installation area 212, the installation area 212 is, for example, a bonding area for mounting the optoelectronic chip 22 such as an LED chip. The hollow structure penetrates through two opposite surfaces of the transparent substrate 21 and is located at periphery of the installation area 212. The optoelectronic chip 22 such as the LED chip is arranged in the installation area 212. The electrodes 23 are arranged on the transparent substrate 21 and electrically connected to the optoelectronic chip 22 such as the LED chip. The electrodes 23 are arranged in pairs. The wavelength conversion layer 24 is arranged on the two opposite surfaces of the transparent substrate 21 and filled in the hollow structure. The optoelectronic chip 22 such as the LED chip is covered by the wavelength conversion layer 24. The hollow structure includes, for example, a hollow unit 2111, a hollow unit 2112 and a hollow unit 2113 on a first side 2121, a second side 2122 and a third side 2123 of the installation area 212.

The difference between the optoelectronic device 20 and the optoelectronic device 10 is that, as shown in FIG. 7a, the hollow unit 2111, the hollow unit 2112 and the hollow unit 2113 of the optoelectronic device 20 are, for example, continuous elongated through-holes penetrating through two opposite surfaces of the transparent substrate 21, and the hollow unit 2111 and the hollow unit 2113 are not communicated, the hollow unit 2112 and the hollow unit 2113 are not communicated. Alternatively, as shown in FIG. 7c, the hollowing unit 2111 and the hollowing unit 2113 are communicated, and the hollowing unit 2112 and the hollowing unit 2113 are not communicated. A width of the continuous elongated through-hole mentioned above is, for example, in a range of 0.2 mm-0.5 mm. The width of the elongated through-hole is set so that the fluorescent glue can smoothly enter the through hole, and considering the thickness of the transparent substrate itself, the minimum margin from the hollow unit to the transparent substrate can be set to be greater than or equal to 0.15 mm. The miscommunication of the hollow units provided on at least two sides can enhance the structural stability of the optoelectronic device 20. FIG.

7a and FIG. 7c show that the shape is not the final shape of the product (there is no fluorescent glue), because in the actual manufacturing process, fluorescent glue needs to be coated first, and then cut to form a final packaged product, so in the final packaged product, at least a part of the outer surfaces of the two opposite sides of the transparent substrate with the hollow structure is not covered by the fluorescent glue.

Third Embodiment

Figure 8:
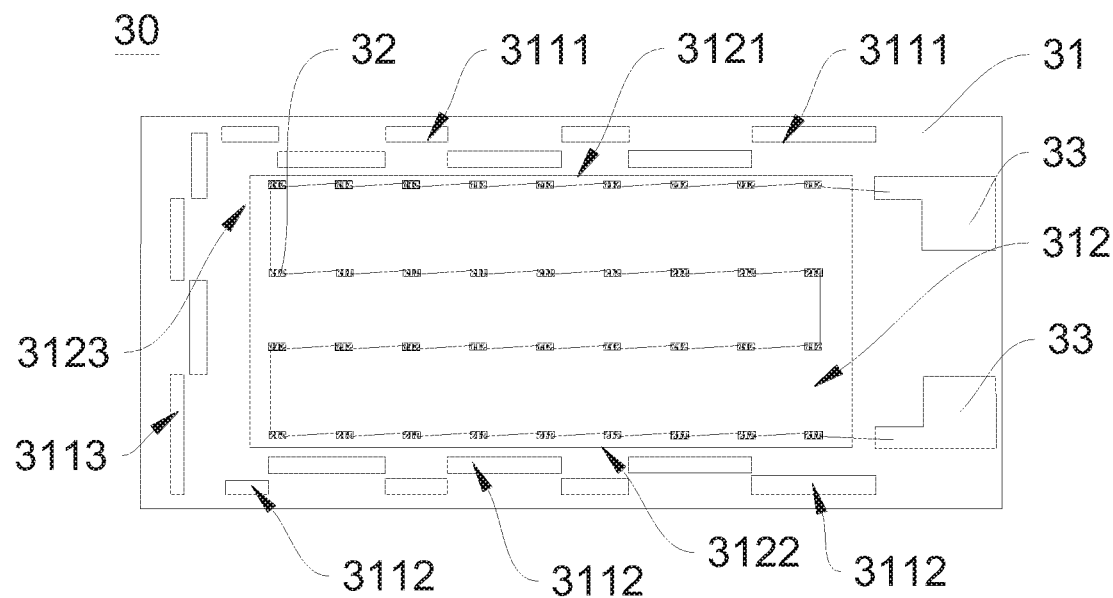
FIG. 8 is a partial schematic structural view of an optoelectronic device according to a third embodiment of the disclosure.

As shown in FIG. 8, a third embodiment of the disclosure provides an optoelectronic device. As shown in FIG. 8, the optoelectronic device 30 is similar to the optoelectronic device 10, and includes, for example, a transparent substrate 31, an optoelectronic chip 32, electrodes 33 and a wavelength conversion layer (FIG. 8 is not shown). Among them, the transparent substrate 31 is provided with a hollow structure and an installation area 312, the installation area 312 is, for example, a bonding area for mounting the optoelectronic chip 32 such as an LED chip.

The difference between the optoelectronic device 30 and the optoelectronic device 10 is that, the hollow unit 3111, the hollow unit 3112 and the hollow unit 3113 include, for example, a plurality of elongated through-holes arranged staggeredly and penetrating through the two opposite surfaces of the transparent substrate 31, and the hollow unit 3111 and the hollow unit 3113 are not communicated, the hollow unit 3112 and the hollow unit 3113 are not communicated. A width of each of the plurality of elongated through-holes mentioned above is, for example, in a range of 0.2 mm-0.5 mm. The width of the elongated through-hole is set so that the fluorescent glue can smoothly enter the through hole, and considering the thickness of the transparent substrate itself, the minimum distance from the hollow unit to the edge of the transparent substrate can be set to be greater than or equal to 0.15 mm. Multiple staggered the elongated through-holes can enhance the firmness of the installation area of the transparent substrate. FIG. 8 shows that the shape is not the final shape of the product (there is no fluorescent glue), because in the actual manufacturing process, fluorescent glue needs to be coated first, and then cut to form a final packaged product, so in the final packaged product, at least a part of the outer surfaces of the two opposite sides of the transparent substrate with the hollow structure is not covered by the fluorescent glue.

Fourth Embodiment

Figure 9A:
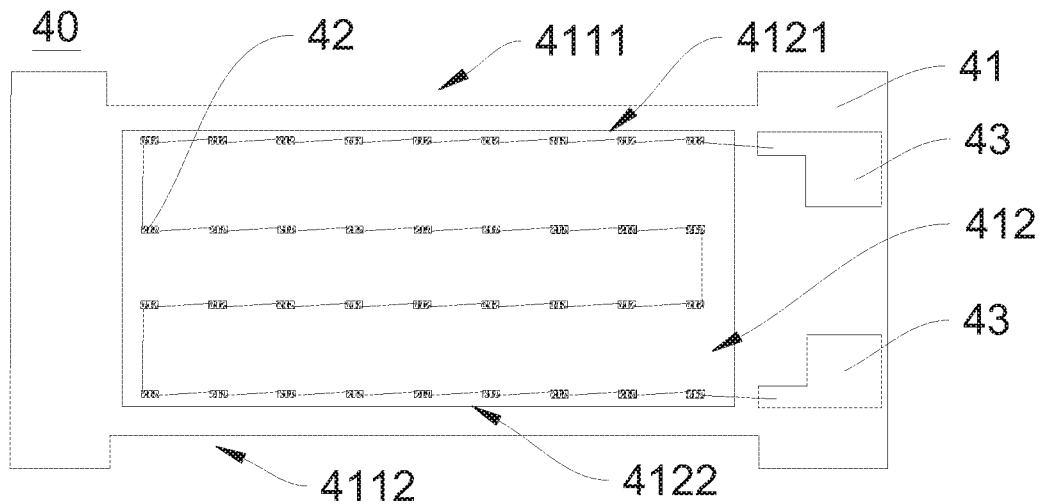
FIG. 9a is a partial schematic structural view of an optoelectronic device according to a fourth embodiment of the disclosure.

As shown in FIG. 9a, a fourth embodiment of the disclosure provides an optoelectronic device. As shown in FIG. 9a, the optoelectronic device 40 is similar to the optoelectronic device 10, and includes, for example, a transparent substrate 41, an optoelectronic chip 42, electrodes 43 and a wavelength conversion layer (FIG is not shown). Among them, the transparent substrate 41 is provided with a hollow structure and an installation area 412, the installation area 412 is, for example, a bonding area for mounting the optoelectronic chip 42 such as an LED chip.

Figure 9B:
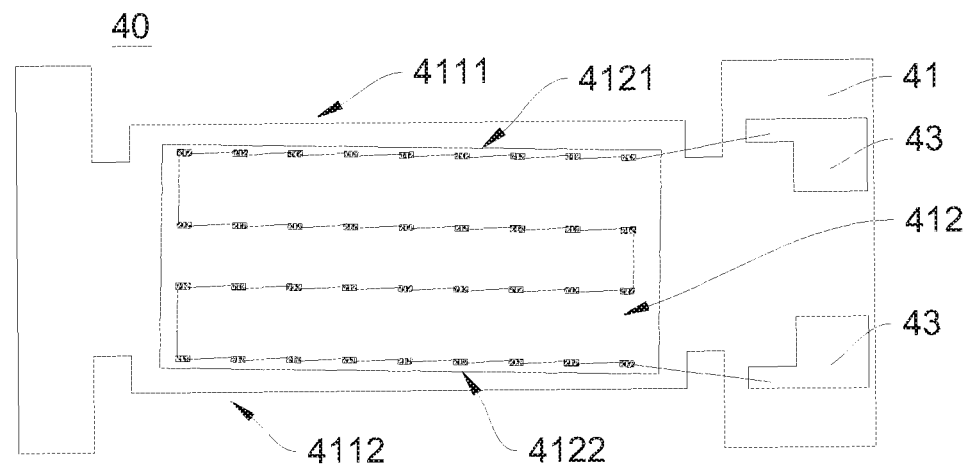
FIG. 9b is another schematic structural view of an optoelectronic device according to the fourth embodiment of the disclosure.
Figure 9C:
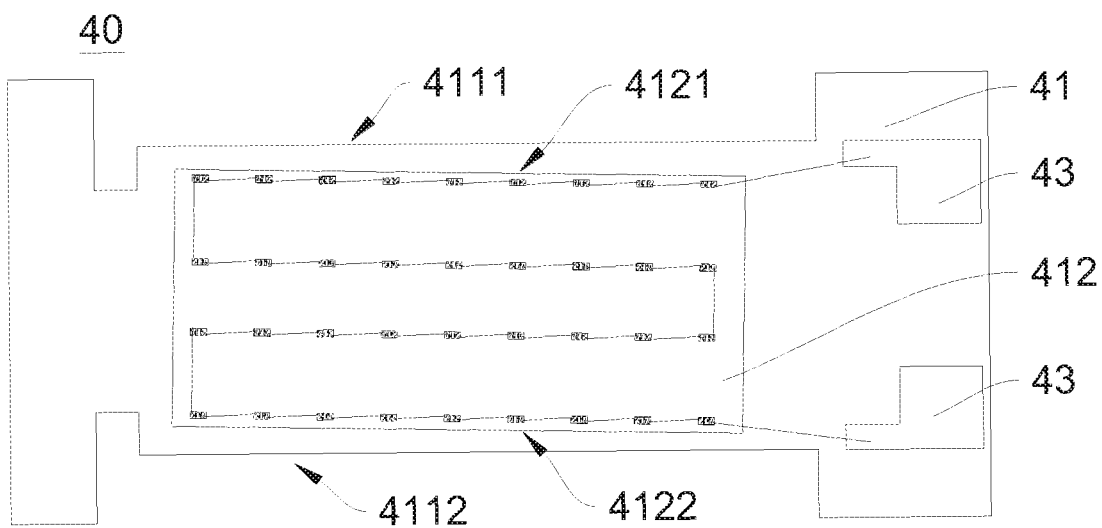
FIG. 9c is still another schematic structural view of an optoelectronic device according to the fourth embodiment of the disclosure.

The difference between the optoelectronic device 40 and the optoelectronic device 10 is that, the hollow structure in the optoelectronic device 40 includes, for example, a hollow unit 4111 and a hollow unit 4112 located on a first side 4121 and a second side 4122 of the installation area 412, respectively, and the hollow unit 4111 and the hollow unit 4112 are elongated side troughs penetrating through the two opposite surfaces of the transparent substrate 41. The hollowing unit 4111 and the hollowing unit 4112 may also be, for example, elongated side troughs of FIG. 9b or FIG. 9c. Among them, the arrangement of the elongated side troughs can enhance the structural stability of the optoelectronic device and the firmness of the installation area. A small trough is provided on one side or both sides of the elongated side trough, which can prevent glue overflow. FIG. 9a, FIG. 9b and FIG. 9c show that the shape is not the final shape of the product (there is no fluorescent glue), because in the actual manufacturing process, fluorescent glue needs to be coated first, and the cut to form a final packaged product, so in the final packaged product, at least a part of the outer surfaces of the two opposite sides of the transparent substrate with the hollow structure is not covered by the fluorescent glue.

Fifth Embodiment

Figure 10:
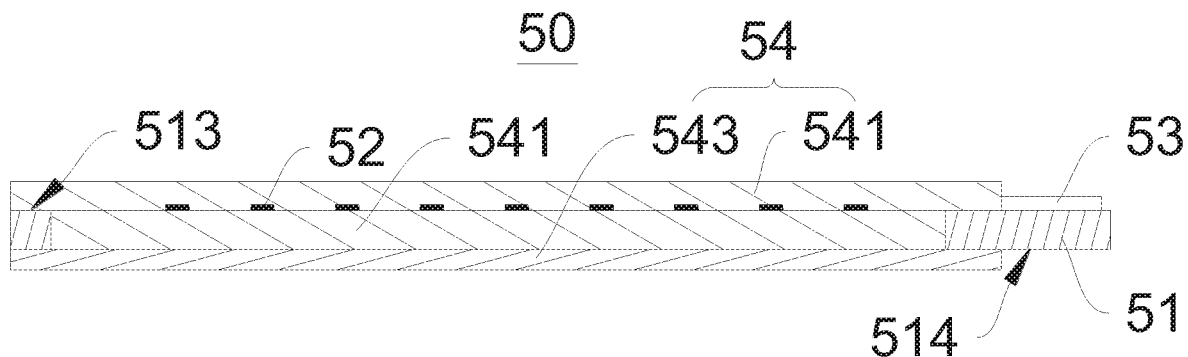
FIG. 10 is a partial schematic structural view of an optoelectronic device according to a fifth embodiment of the disclosure.

As shown in FIG. 10, a fifth embodiment of the disclosure provides an optoelectronic device. As shown in FIG. 10, the optoelectronic device 50 is similar to the optoelectronic device 10, and includes, for example, a transparent substrate 51, an optoelectronic chip 52, electrodes 53 and a wavelength conversion layer 54.

The difference between the optoelectronic device 50 and the optoelectronic device 10 is that, the wavelength conversion layer 54 of the optoelectronic device 50 provided in this embodiment includes, for example, only two wavelength conversion sublayers: a wavelength conversion sublayer 541 and a wavelength conversion sublayer 543. The wavelength conversion sublayer 541 is arranged on a first surface 513 of the two opposite surfaces of the transparent substrate 51, and further covers the optoelectronic chip 52 such as LED chip and filled in the hollow structure. The wavelength conversion sublayer 543 is arranged on a second surface 514 of the two opposite surfaces of the transparent substrate 51, and covers the hollow structure.

The wavelength conversion sublayer 541 is, for example, a fluorescent glue layer, and includes a first matrix and a first phosphor dispersed in the first matrix. The wavelength conversion sublayer 543 is, for example, a fluorescent glue layer, and includes a second matrix and a second phosphor dispersed in the second matrix. The first phosphor and the second phosphor are the same. The first matrix and the second matrix mentioned are, for example, matrixes with different hardness, and a hardness of the first matrix is lower than a hardness of the second matrix. For example, the first matrix and the second matrix use Shore A type hardness tester to measure the hardness, that is, the measured hardness is Shore A hardness. The Shore A hardness of the first matrix is, for example, 55 or less, and the Shore A hardness of the second matrix is, for example, 70 or more. Specifically, the difference between the Shore A hardness of the first matrix and the Shore A hardness of the second matrix may be greater than or equal to 15. In addition, on the premise that the hardness of the first matrix is lower than the hardness of the second matrix, the hardness of the first matrix and the second matrix can also be represented by Shore D hardness, its Shore D hardness is greater than or equal to 20. The material of the first matrix may be a transparent adhesive material, such as epoxy resin, silica gel, methyl silicone resin, phenyl silicone resin, methyl phenyl silicone resin or modified silicone resin. The material of the second matrix may be a transparent adhesive material, such as epoxy resin, silica gel, methyl silicone resin, phenyl silicone resin, methyl phenyl silicone resin or modified silicone resin. In this embodiment, epoxy resin, silica gel, methyl silicone resin, phenyl silicone resin, methyl phenyl silicone resin or modified silicone resin are used as the original materials of the first matrix and the second matrix, and the hardness difference between the first matrix and the second matrix is achieved by adjusting the ratio between the original material of the first matrix or the second matrix, the filler and the auxiliary agent. Similarly, the time and temperature of heat curing of the first matrix or the second matrix can also be used to change its hardness without destroying other physical characteristics. By using the first matrix and the second matrix together, the optoelectronic device 50 can have higher structural strength and lower cost. In addition, since the wavelength conversion sublayer 541 and the wavelength conversion sublayer 542 are formed using different the first matrix and the second matrix, the first matrix can be designed to use materials with higher heat resistance and better heat dissipation performance. The second matrix can be designed to use materials with more general heat resistance and heat dissipation. In this way, it is easy to keep the optoelectronic device 50 at a low cost while ensuring that the entire optoelectronic device 50 dissipates heat quickly and uniformly. It should be noted that in other embodiments of the disclosure, the hardness of the first matrix included in the wavelength conversion sublayer 541 of the optoelectronic device may be the same as the hardness of the second matrix included in the wavelength conversion sublayer 543. In addition, in other embodiments of the disclosure, the wavelength conversion sublayer 541 and the wavelength conversion sublayer 543 of the optoelectronic device have same material.

Sixth Embodiment

Figure 11:
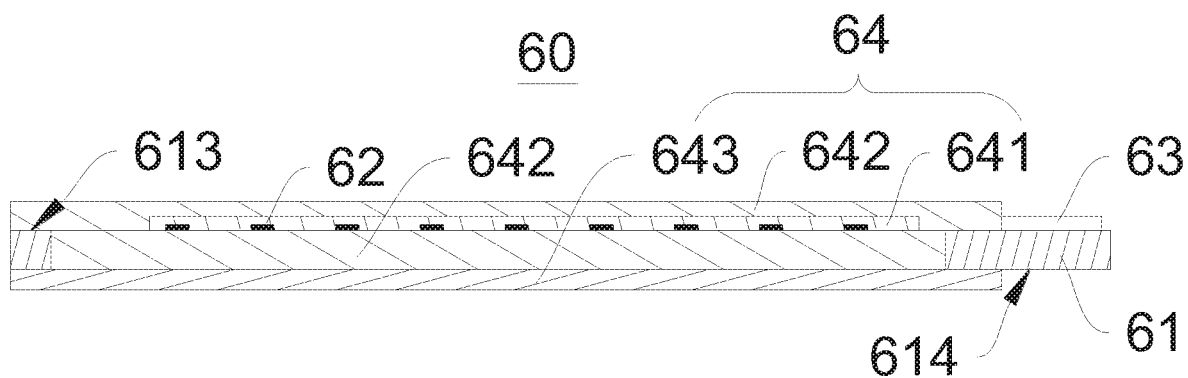
FIG. 11 is a partial schematic structural view of an optoelectronic device according to a sixth embodiment of the disclosure.

As shown in FIG. 11, a sixth embodiment of the disclosure provides an optoelectronic device. As shown in FIG. 11, the optoelectronic device 60 such as LED package structure is similar to the optoelectronic device 10, and includes, for example, a transparent substrate 61, an optoelectronic chip 62, electrodes 63 and a wavelength conversion layer 64. The wavelength conversion layer 64 includes, for example, three wavelength conversion sublayers: a wavelength conversion sublayer 641, a wavelength conversion sublayer 642 and a wavelength conversion sublayer 643. The wavelength conversion sublayer 641 is arranged on a first surface 613 of the two opposite surfaces of the transparent substrate, and in the installation area and further covers the optoelectronic chip 62 such as LED chip. The wavelength conversion sublayer 642 is arranged on a side of the wavelength conversion sublayer 641 facing away from the optoelectronic chip 62 such as LED chip and filled in the hollow structure. The wavelength conversion sublayer 643 is arranged on a second surface 614 of the two opposite surfaces of the transparent substrate 61, and covers the hollow structure. The difference between the optoelectronic device 60 and the optoelectronic device 10 is that, the first matrix included in the wavelength conversion sublayer 642 and the second matrix included in the wavelength conversion sublayer 643 are matrixes having the same hardness. For example, the first matrix and the second matrix use Shore A type hardness tester to measure the hardness, that is, the measured hardness is Shore A hardness. In addition, on the premise that the hardness of the first matrix is same to the hardness of the second matrix, the hardness of the first matrix and the second matrix can also be represented by Shore D hardness. For example, the material of the first matrix and the second matrix may be transparent adhesive material, such as epoxy resin, silica gel, methyl silicone resin, phenyl silicone resin, methyl phenyl silicone resin or modified silicone resin. The wavelength conversion sublayer 641 and the wavelength conversion sublayer 642 are also formed by a dispensing process layer by layer, and the specific process participates in the first embodiment.

Seventh Embodiment

Figure 12:
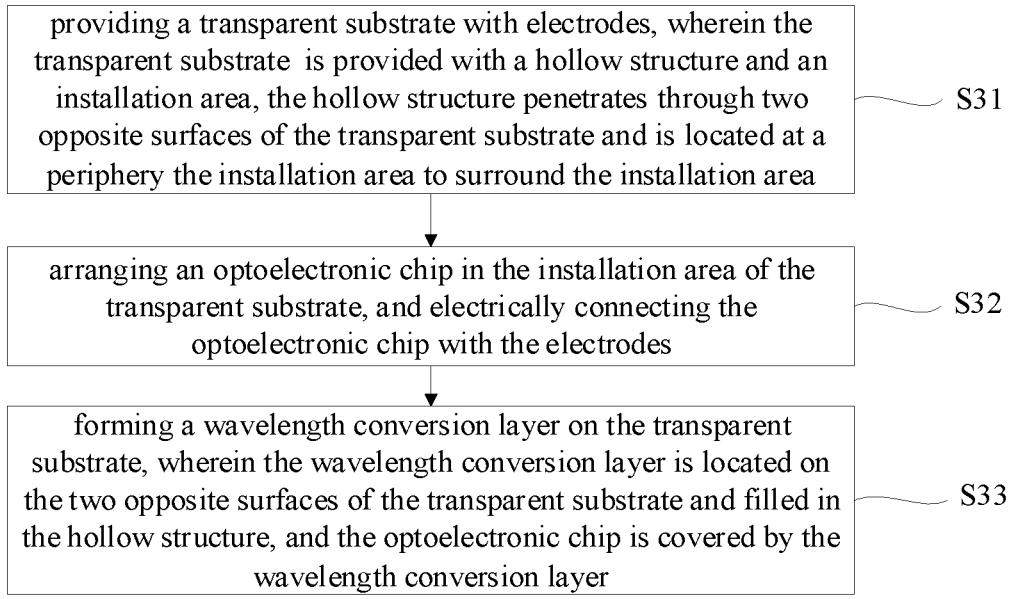
FIG. 12 is a flowchart of a method for manufacturing an optoelectronic device according to a seventh embodiment of the disclosure.

Referring to FIG. 12, a seventh embodiment of the disclosure provides a method for manufacturing an optoelectronic device such as an LED package structure. Specifically, the manufacturing method includes the following steps, for example:

Step S31: providing a transparent substrate with electrodes, the transparent substrate being provided with a hollow structure and an installation area, the hollow structure penetrating through two opposite surfaces of the transparent substrate and being located at a periphery of the installation area to surround the installation area;

Step S32: arranging an optoelectronic chip in the installation area of the transparent substrate, and electrically connecting the optoelectronic chip with the electrodes;

Step S33: forming a wavelength conversion layer on the transparent substrate, the wavelength conversion layer being located on the two opposite surfaces of the transparent substrate and filled in the hollow structure, and the optoelectronic chip being covered by the wavelength conversion layer.

Figure 13:
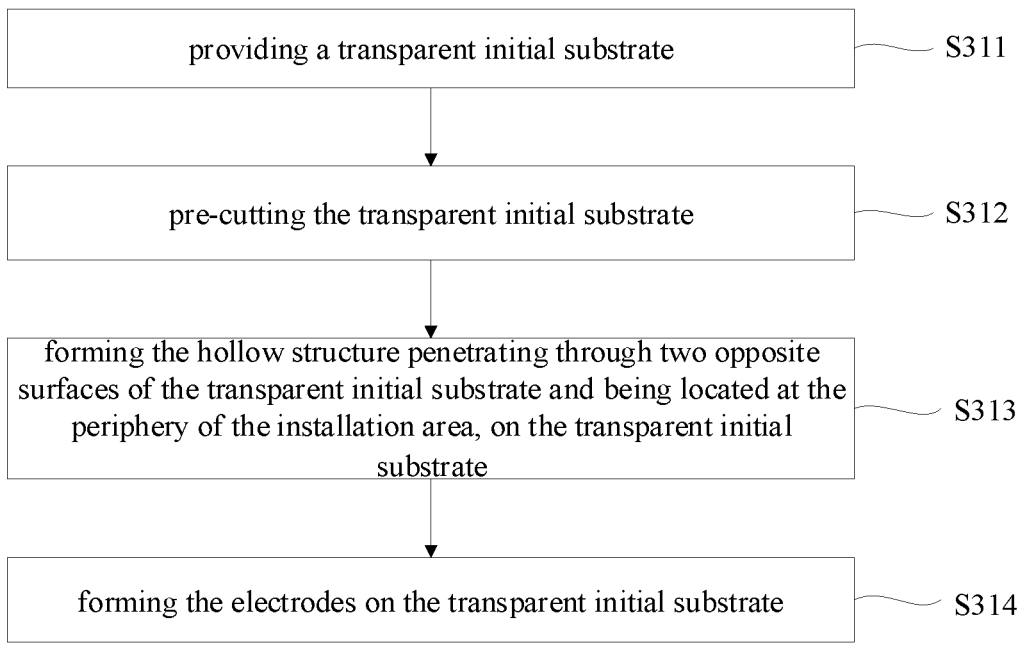
FIG. 13 is a flowchart of step S31 in the method for manufacturing the optoelectronic device according to the seventh embodiment of the disclosure.
Figure 14:
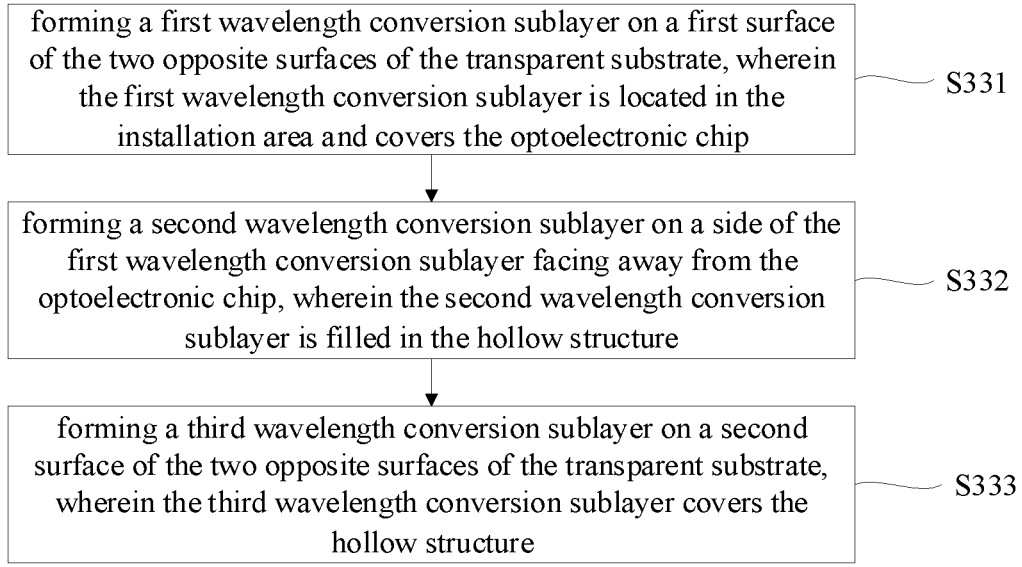
FIG. 14 is a flowchart of step S33 in the method for manufacturing the optoelectronic device according to the seventh embodiment of the disclosure.

As shown in FIG. 13, step S31 includes, for example, steps S311 to S314.

Step S311: providing a transparent initial substrate;

Step S312: pre-cutting the transparent initial substrate;

Step S313: forming the hollow structure penetrating through two opposite surfaces of the transparent initial substrate and being located at the periphery of the installation area, on the transparent initial substrate; and Step S314: forming the electrodes on the transparent initial substrate.

Specifically, the transparent initial substrate mentioned in step S311 is composed of a transparent material such as ceramics or blue glass. The ceramic is, for example, one of alumina, aluminum nitride, zirconia, and calcium fluoride. And the transparent initial substrate is, for example, an array including a plurality of transparent substrates. The pre-cutting mentioned in step S312 does not cut the transparent initial substrate, and performs pre-cutting to facilitate subsequent complete cutting. The installation area mentioned in step S313 is, for example, a bonding area, that is, an installation area of an optoelectronic chip such as an LED chip. The electrodes mentioned in step S314 is made by a thick film process or a thin film process, for example, step S314 specifically includes silver disks made by a thick film process such as sintering on the rear substrate as the electrodes, or a thin film process such as steaming copper plates, nickel plates or gold plates made by plating or sputtering are used as the electrodes.

In step S32, it is mentioned that the optoelectronic chip is, for example, an LED chip. Step S32 includes, for example, depositing silver glue in the installation area, and then using vacuum suction nozzles to pick up and place the LED chips in the installation area, sintering to cure the silver glue, and then connecting each LED chip with a bonding wire to form electricity connection with the electrodes, and the bonding wire are completed using pressure welding, for example.

Further, as shown in FIG. 13, step S33 involved in this embodiment includes, for example, steps S331 to S333.

Step S331: forming a first wavelength conversion sublayer on a first surface of the two opposite surfaces of the transparent substrate, and the first wavelength conversion sublayer is located in the installation area and covers the optoelectronic chip;

Step S332: forming a second wavelength conversion sublayer on a side of the first wavelength conversion sublayer facing away from the optoelectronic chip, and the second wavelength conversion sublayer is filled in the hollow structure; and Step S333: forming a third wavelength conversion sublayer on a second surface of the two opposite surfaces of the transparent substrate, and the third wavelength conversion sublayer covers the hollow structure.

In the step S331, the mentioned first wavelength conversion sublayer is, for example, a fluorescent glue layer. And the fluorescent glue layer includes, for example, a third phosphor and a third matrix. The third matrix is, for example, a transparent colloid, such as epoxy resin, silica gel, methyl silicone resin, phenyl silicone resin, methyl phenyl silicone resin, or modified silicone resin. The third phosphor is, for example, a single-color phosphor, for example, a red phosphor. Step S331 specifically includes: mixing and stirring the red phosphor with the third matrix at a concentration of 3-10% to form a first wavelength conversion sublayer, and then dispensing the mixture to the first surface of the two opposite surfaces of the transparent substrate at a glue amount of 50-1000 mg, which is located in the installation area and covers the optoelectronic chip, after the dispensing is completed, short baking is performed to form the first wavelength conversion sublayer.

In step S332, the mentioned second wavelength conversion sublayer is, for example, a fluorescent glue layer, and includes, for example, a first matrix and a first phosphor. The first phosphor is, for example, a single-color phosphor or a mixture of phosphors. For example, the first phosphor is a mixture of yellow phosphor and green phosphor. The first matrix is, for example, a transparent adhesive material, such as epoxy resin, silica gel, methyl silicone resin, phenyl silicone resin, methyl phenyl silicone resin, or modified silicone resin. Step S332 specifically includes: after mixing the mixture of the yellow phosphor and the green phosphor powder with the first matrix at a concentration of 20-60%, and then mixing the yellow-green fluorescent glue point at the side of the first wavelength conversion sublayer away from the optoelectronic chip with the glue amount of 100-2000 mg, and filling the hollow structure, and after the dispensing is completed, a long baking is performed to form a second wavelength conversion sublayer. In some embodiments, the yellow-green fluorescent glue mentioned in step S332 may also contain some red phosphor or orange phosphor to improve the color rendering of the final product.

In step S333, the mentioned third wavelength conversion sublayer is, for example, a fluorescent glue layer, and the third wavelength conversion sublayer includes, for example, a second phosphor and a second matrix. The second phosphor is the same as the first phosphor. The hardness of the second matrix mentioned is, for example, the same as the hardness of the first matrix, or the hardness of the second matrix mentioned is, for example, greater than the hardness of the first matrix. The first matrix and the second matrix are, for example, measured using Shore A hardness testers, that is, the measured hardness is Shore A hardness. The Shore A hardness of the first matrix is, for example, 55 or less, and the Shore A hardness of the second matrix is, for example, 70 or more. Specifically, the difference between the Shore A hardness of the first matrix and the Shore A hardness of the second matrix may be greater than or equal to 15. In addition, on the premise of that the hardness of the first matrix is lower than the hardness of the second matrix, the hardness of the first matrix and the second matrix can also be represented by Shore D hardness, its Shore D hardness is greater than or equal to 20. In this embodiment, epoxy resin, silica gel, methyl silicone resin, phenyl silicone resin, methyl phenyl silicone resin or modified silicone resin are used as the original materials of the first matrix and the second matrix, and the hardness difference between the first matrix and the second matrix is achieved by adjusting the ratio between the original material of the first matrix or the second matrix, the filler and the auxiliary agent. Similarly, the time and temperature of heat curing of the first matrix or the second matrix can also be used to change its hardness without destroying other physical characteristics. Step S333 specifically includes: mixing the mixture of the yellow phosphor and the green phosphor with the second matrix at a concentration of 20-60% to form a yellow-green fluorescent glue, and then mixing the yellow-green fluorescent glue point to the second surface of the two opposite surfaces of the transparent substrate at a glue amount of 100-2000 mg, which covering the installation area, and after the dispensing is completed, a long baking is performed to form the third wavelength conversion sublayer. In some embodiments, the yellow-green fluorescent glue mentioned in step S333 may also contain some red phosphor or orange phosphor to improve the color rendering of the final product.

It should be noted that, in other embodiments of the disclosure, step S33 includes, for example, forming a first wavelength conversion sublayer on the first surface of the two opposing surfaces of the transparent substrate, and the first wavelength conversion sublayer covers the optoelectronic chip and fills the hollow structure; and forming a second wavelength conversion sublayer on the second surface of the two opposite surfaces of the transparent substrate and the second wavelength conversion sublayer covers the hollow structure. At this time, the first wavelength conversion sublayer includes a first matrix and first phosphor dispersed in the first matrix, and the second wavelength conversion sublayer includes a second matrix and second phosphor dispersed in the second matrix. The mentioned first phosphor and second phosphor are, for example, the same monochromatic phosphor or the same mixture of phosphors. For example, the first phosphor and the second phosphor mentioned make the light emitted by the optoelectronic chip mix with the light converted by the first phosphor and the second phosphor to obtain white light. The mentioned first matrix and second matrix may be matrixes with the same hardness, or matrixes with different hardness. When the hardness of the first matrix and the second matrix are different, the hardness of the first matrix included in the first wavelength conversion sublayer is lower than the hardness of the second matrix included in the second wavelength conversion sublayer.

It should be noted that the manufacturing method of the optoelectronic device such as the LED package structure provided in this embodiment is used to manufacture the optoelectronic device such as the LED package structure provided by the foregoing embodiment. For a specific introduction to the optoelectronic device, refer to the foregoing embodiment.

Figure 15:
FIG. 15 is a schematic structural view of the method for manufacturing optoelectronic device according to the seventh embodiment of the disclosure, which relates to a whole-plate optoelectronic device.

In addition, as shown in FIG. 15, in industrial production, a plurality of optoelectronic devices such as LED package structures are often formed on a large transparent initial substrate, and finally cut to obtain a monolithic light source optoelectronic device. That is, after the foregoing step S33, for example, the method further includes: cutting an optoelectronic device such as an LED package structure after forming a wavelength conversion layer to obtain a monolithic light source optoelectronic device such as a single LED package structure, and cutting here may be understood as cutting according to pre-cutting marks transparent substrate. The optoelectronic device manufactured according to the method provided in the embodiment is cut and shaped after the fluorescent glue is coated, and at least a part of the outer surface of the two opposite sides of the transparent substrate with the hollow structure is not covered by the fluorescent glue.

In summary, the manufactory method of the optoelectronic device such as the LED package structure provided in this embodiment by filling the wavelength conversion layer such as a fluorescent glue layer in the hollow structure, which can effectively reduce the proportion of blue light exposed from the side of the transparent substrate when the optoelectronic chip such as the LED chip is lit, and effectively reduce the damage to human eyes; moreover, compared to the traditional dispensing process, the dispensing process layer by layer for forming the first wavelength conversion sublayer first and then the second wavelength conversion sublayer on the optoelectronic chip such as the LED chip can effectively improve the brightness of the optoelectronic chip such as the LED chip.

Finally, it should be noted that the foregoing description merely illustrates some embodiments of the disclosure, and is not intended to limit the scope of the disclosure. Although the disclosure has been disclosed in the above embodiments, it is not intended to limit the disclosure. Any person skilled in the art can make some amendments or modifications as equivalent embodiments according to the above disclosed technical contents without departing from the technical scope of the disclosure. As long as they are without departing from the technical scope of the disclosure, any simple amendments, equivalent changes and modifications to the above embodiments according to the technical essence of the disclosure are still within the technical scope of the disclosure.

What is claimed is:

1. An optoelectronic device, comprising:
   a transparent substrate, provided with a hollow structure and an installation area, wherein the hollow structure penetrates through two opposite surfaces of the transparent substrate and is located at a periphery of the installation area;
   an optoelectronic chip, arranged in the installation area;
   electrodes, arranged on the transparent substrate and electrically connected to the optoelectronic chip; and
   a wavelength conversion layer, arranged on the two opposite surfaces of the transparent substrate and filled in the hollow structure, wherein the optoelectronic chip is covered by the wavelength conversion layer;
   wherein the hollow structure comprises a first hollow unit arranged on a first side of the installation area, and the first hollow unit comprises a plurality of elongated through-holes arranged staggeredly and penetrating through the two opposite surfaces of the transparent substrate.

2. The optoelectronic device as claimed in claim 1, wherein the hollow structure further comprises a second hollow unit arranged on a second side of the installation area, and the second side being opposite to the first side.

3. The optoelectronic device as claimed in claim 2, wherein the hollow structure further comprises a third hollow unit arranged on a third side of the installation area, the third side is located between the first side and the second side.

4. The optoelectronic device as claimed in claim 3, wherein the third hollow structure unit comprises a plurality of elongated through-holes arranged staggeredly and penetrating through the two opposite surfaces of the transparent substrate.

5. The optoelectronic device as claimed in claim 2, wherein a width of each of the plurality of elongated through-holes is in a range of 0.2 mm-0.5 mm.

6. The optoelectronic device as claimed in claim 2, wherein the second hollow structure unit comprises a plurality of elongated through-holes arranged staggeredly and penetrating through the two opposite surfaces of the transparent substrate.

7. The optoelectronic device as claimed in claim 1, wherein the wavelength conversion layer comprises:
   a first wavelength conversion sublayer, arranged on a first surface of the two opposite surfaces and in the installation area, and further covering the optoelectronic chip;
   a second wavelength conversion sublayer, arranged on a side of the first wavelength conversion sublayer facing away from the optoelectronic chip and filled in the hollow structure; and
   a third wavelength conversion sublayer, arranged on a second surface of the two opposite surfaces and covering the hollow structure.

8. The optoelectronic device as claimed in claim 7, wherein the second wavelength conversion sublayer comprises a first matrix and a first phosphor dispersed in the first matrix, the third wavelength conversion sublayer comprises a second matrix and a second phosphor dispersed in the second matrix, the first phosphor and the second phosphor are a same monochromatic phosphor or a same mixture of phosphors.

9. The optoelectronic device as claimed in claim 8, wherein the optoelectronic chip is located on the first surface, and a hardness of the first matrix is lower than a hardness of the second matrix.

10. The optoelectronic device as claimed in claim 7, wherein the first wavelength conversion sublayer and the second wavelength conversion sublayer are formed by a dispensing process layer by layer;
    wherein a wavelength of an excited peak of the first wavelength conversion sublayer is within a first wavelength range, a wavelength of an excited peak of the second wavelength conversion sublayer is within a second wavelength range, and the second wavelength range is different from the first wavelength range.

11. An optoelectronic device, comprising:
    a transparent substrate, provided with a hollow structure and an installation area, wherein the hollow structure penetrates through two opposite surfaces of the transparent substrate and is located at a periphery of the installation area;
    an optoelectronic chip, arranged in the installation area;
    electrodes, arranged on the transparent substrate and electrically connected to the optoelectronic chip; and
    a wavelength conversion layer, arranged on the two opposite surfaces of the transparent substrate and filled in the hollow structure, wherein the optoelectronic chip is covered by the wavelength conversion layer;
    wherein the hollow structure comprises a first hollow unit and a second hollow unit respectively arranged on a first side and a second side of the installation area, and the second side being opposite to the first side;

wherein the hollow structure further comprises a third hollow unit arranged on a third side of the installation area, the third side is located between the first side and the second side;

wherein each of the first hollow structure unit, the second hollow structure unit and the third hollow structure unit is a continuous elongated through-hole penetrating through the two opposite surfaces of the transparent substrate;

wherein the first hollow structure unit and the third hollow structure unit together form a L-shaped continuous elongated through-hole penetrating through the two opposite surfaces of the transparent substrate; or the first hollow structure unit, the second hollow structure unit and the third hollow structure unit together form an U-shaped continuous elongated through-hole penetrating through the two opposite surfaces of the transparent substrate.

\* \* \* \* \*